United States Patent
Schmolke et al.

(10) Patent No.: US 6,630,024 B2
(45) Date of Patent: Oct. 7, 2003

(54) METHOD FOR THE PRODUCTION OF AN EPITAXIALLY GROWN SEMICONDUCTOR WAFER

(75) Inventors: Rüdiger Schmolke, Burghausen (DE); Reinhard Schauer, Laufen (DE); Günther Obermeier, Palling (DE); Dieter Gräf, Burghausen (DE); Peter Storck, Mehring (DE); Klaus Messmann, Burghausen (DE); Wolfgang Siebert, Mehring (DE)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/864,994

(22) Filed: May 24, 2001

(65) Prior Publication Data

US 2002/0022351 A1 Feb. 21, 2002

(30) Foreign Application Priority Data

May 25, 2000 (DE) .......................... 100 25 871

(51) Int. Cl.⁷ .......................... C30B 25/00; C30B 29/06; C30B 28/02
(52) U.S. Cl. ........................ 117/106; 117/94; 117/90; 117/97; 117/935
(58) Field of Search ................ 117/94, 97, 90, 117/106

(56) References Cited

U.S. PATENT DOCUMENTS

| | | | |
|---|---|---|---|
| 4,389,273 A | | 6/1983 | Bloem et al. |
| 4,859,626 A | | 8/1989 | Wise |
| 5,037,774 A | * | 8/1991 | Yamawaki et al. ............ 117/8 |
| 5,360,509 A | | 11/1994 | Zakaluk et al. |
| 5,378,651 A | * | 1/1995 | Agnello et al. ............... 117/84 |
| 5,571,373 A | * | 11/1996 | Krishna et al. ............. 438/693 |
| 5,574,307 A | * | 11/1996 | Kageyama et al. ......... 257/607 |
| 5,643,405 A | * | 7/1997 | Bello et al. ................. 438/692 |
| 5,705,409 A | * | 1/1998 | Witek ......................... 438/212 |
| 5,945,704 A | * | 8/1999 | Schrems et al. ............ 257/296 |
| 5,961,713 A | * | 10/1999 | Wijaranakula ................ 117/2 |
| 6,190,453 B1 | * | 2/2001 | Boydston et al. ............. 117/89 |
| 6,221,168 B1 | * | 4/2001 | Carter et al. ................... 134/1 |
| 6,338,756 B2 | * | 1/2002 | Dietze .......................... 117/97 |

FOREIGN PATENT DOCUMENTS

| | | |
|---|---|---|
| DE | 1949871 | 4/1970 |
| DE | 69510300 | 6/1999 |
| DE | 19905737 | 12/2000 |
| EP | 0 711 854 | 5/1996 |
| EP | 0711854 | 5/1996 |
| EP | 0 959 154 | 11/1999 |
| EP | 0959154 | 11/1999 |
| WO | 01/06044 | 1/2001 |

OTHER PUBLICATIONS

Patent Abstract of Japan. English Abstract of JP 2001–244272 (2001).*
HCAPLUS on STN, AN 1994:174075.
English Derwent Abstract AN 1970–25277R corresponding to DE 1 949 871.
English Derwent Abstract AN 2000–579981 corresponding to DE 199 05 737.
H. M. Liaw and F. W. Rose, Epitaxial Silicon Technology; Academic Press Inc.; 1986; p. 71–73.
M. L. Hammond, Handbook of Thin–Film Deposition Processes and Techniques; 1988; p. 32–33.
M. Hourai et al., The Electrochem. Soc., P.;V98–1, 1998, p. 453.
G. Kissinger et al., Appl. Phys. Lett., 1998, p. 223.

* cited by examiner

*Primary Examiner*—Benjamin L. Utech
*Assistant Examiner*—Matthew J Song
(74) *Attorney, Agent, or Firm*—Collard & Roe, P.C.

(57) ABSTRACT

A method for the production of a semiconductor wafer having a front and a back and an epitaxial layer of semiconductor material deposited on the front, includes the following process steps:

(a) preparing a substrate wafer having a polished front and a specific thickness;

(b) pretreating the front of the substrate wafer in the presence of HCl gas and a silane source at a temperature of from 950 to 1250 degrees Celsius in an epitaxy reactor, the thickness of the substrate wafer remaining substantially unchanged; and (c) depositing the epitaxial layer on the front of the pretreated substrate wafer.

25 Claims, No Drawings

METHOD FOR THE PRODUCTION OF AN EPITAXIALLY GROWN SEMICONDUCTOR WAFER

BACKGROUND OF THE INVENTION

1. Field of the Invention

The present invention relates to a method for the production of a semiconductor wafer having a front and a back and an epitaxial layer of semiconductor material deposited on the front.

2. The Prior Art

According to the prior art, epitaxially grown semiconductor wafers are produced from suitable intermediate products by the process sequence of abrasive polishing—finish polishing—cleaning—epitaxy. The surface roughness after the abrasive polishing, is measured using the atomic force microscope (AFM) method in an area of 1 μm by 1 μm, being from about 0.5 to 3 nm RMS (root-mean-square), depending on the processing conditions, and being from about 0.05 to 0.2 nm RMS after the finish polishing.

EP 711 854 A1 describes a method for the production of an epitaxially grown wafer, in which a sawn—lapped—etched silicon wafer is abrasively polished. A surface roughness of from 0.3 to 1.2 nm RMS (AFM, 1 μm by 1 μm) is created and, to reduce costs, an epitaxial silicon layer is deposited without carrying out a smoothing finish polishing step. Although the epitaxy layer produced in this way is comparable, in terms of its electrical properties, with an epitaxy layer produced conventionally with prior use of a finish polishing step, there is a higher incidence of localized light scatterers (LLS) on the epitaxially grown surface. This is due to the relatively high initial roughness, and potentially leads to increased rejection of components produced on these wafers.

It is also known that defects in the substrate wafer, which can be detected as oxide precipitates, after the deposition of the epitaxial layer cause an increased number of localized light scatterers. EP-959154 A1 describes heat treatment of the substrate wafer, which precedes the epitaxial deposition and reduces the number of near-surface defects. It has been found, however, that the reduction which can be achieved in this way, especially when using substrate wafers in which a large number of such defects can be detected, is insufficient or entails high costs. The efficiency of the defect reduction depends on the length of the heat treatment. When the heat treatment is carried out only to an extent for which the associated costs remain at a tolerable level, an undesirably high number of localized light scatterers is found on the epitaxially grown surface.

SUMMARY OF THE INVENTION

It is an object of the present invention to provide a method which leads to an epitaxially grown semiconductor wafer that does not exhibit these disadvantages in terms of roughness and the number of localized light scatterers on the epitaxially grown surface, and which is also suitable for the use of semiconductor wafers having defects that can be detected as oxide precipitates.

Another object of the present invention is to provide a wafer in which the other properties of the epitaxially grown semiconductor wafer are at least as good as those of epitaxially grown semiconductor wafers produced according to the prior art.

The above objects are achieved according to the present invention which relates to a method for the production of a semiconductor wafer having a front and a back and an epitaxial layer of semiconductor material deposited on the front, which comprises the following process steps:

(a) preparing a substrate wafer having a polished front and a specific thickness;

(b) pretreating the front of the substrate wafer in the presence of HCl gas and a silane source at a temperature of from 950 to 1250 degrees Celsius in an epitaxy reactor, the thickness of the substrate wafer remaining substantially unchanged; and (c) depositing the epitaxial layer on the front of the pretreated substrate wafer.

The method of the invention makes it possible to obtain a semiconductor wafer in which the surface of the epitaxial layer has a maximum density of 0.14 localized light scatterers per $cm^2$ with a scattering cross section of greater than or equal to 0.12 μm. Before the epitaxial layer is deposited, the front of the substrate wafer has a surface roughness of from 0.05 to 0.2 nm RMS, measured by AFM or a 1 μm by 1 μm large reference area. The semiconductor wafer is suitable for use in the semiconductor industry, especially for the fabrication of electronic components having linewidths equal to or less than 0.18 μm.

Regarding step (a) of the process sequence according to the invention:

To produce the epitaxially grown semiconductor wafer according to the invention, a substrate wafer which, after separation from a crystal, has been, for example, lapped and etched or ground and etched or only ground, or is only in the sawn state. This substrate wafer is then subjected to an abrasive polish and optionally a finish polish finishing), the polish being carried out either on both sides at the same time or only on the front of the substrate wafer. A suitable polishing process for substrate wafers polished on two sides is described, for example, in DE-199 05 737 C1. The substrate wafer may be low in defects or affected by defects which can be detected as large near-surface oxide precipitates or as oxide-filled voids.

According to a preferred embodiment of the invention which, in particular, is preferred with regard to low costs, in step (a) of the method a substrate wafer having a polished front is prepared, for whose production only a single polishing step, i.e. an abrasive polish, is used. No finish polish is employed. The substrate wafer is removed from the polishing machine and is subjected to cleaning and drying according to the prior art. The cleaning may be implemented either as a batch method, with the simultaneous cleaning of a plurality of substrate wafers in baths, or by spraying methods, or alternatively as a single-wafer process.

According to a further, preferred embodiment of the invention, a polished substrate wafer is prepared in step (a) which is rich in defects that can be detected as large near-surface oxide precipitates or as oxide-filled voids. Such a substrate wafer lies within the scope of the invention if the density of defect seeds in at least one region of the substrate wafer, according to OSF testing (conditions: wet oxidation at 1100° C. for 2 hours with subsequent Secco treatment for 3 minutes (doping: p−) or wet oxidation at 1100° C. for 2 hours with subsequent Wright treatment for 3 minutes (doping: p+)), reaches a value of least 5/$cm^2$ (near-surface oxide precipitates) or, after 20 min of non-shaken Secco treatment, at least 2 μm large Secco etch pits and/or large pits with a density of at least 0.05/$cm^2$ (oxide-filled voids) are found in the void-rich region of the wafer. This is generally the case if the oxygen concentration is in the range of from $3*10^{17}$ to $9*10^{17}$ atoms of oxygen $cm^{-3}$, preferably from $5*10^{17}$ to $7.5*10^{17}$ atoms of oxygen $cm^{-3}$, and the concentration is determined according to the American ASTM standard, and at least one of the following conditions is satisfied with respect to dopants and their concentrations in the substrate wafer.

The nitrogen concentration is in the range of from $1*10^{10}$ to $5*10^{15}$ atoms of nitrogen $cm^{-3}$, preferably from $5*10^{12}$ to $5*10^{15}$ atoms of nitrogen $cm^{-3}$. The carbon concentration is in the range of from $1*10^{15}$ to $5*10^{17}$ atoms of carbon $cm^{-3}$, preferably from $1*10^{16}$ to $5*10^{17}$ atoms of carbon $cm^{-3}$. The boron concentration is in the range of more than $5*10^{17}$ atoms of boron $cm^{-3}$. The described category of substrate wafers affected by defects includes, in particular, silicon wafers on which an annular buildup of defect seeds, a so-called OSLO ring, car be A detected (OSF=oxidation induced stacking fault) and silicon wafers which have a high density of oxide-filled voids in the crystal (M. Hourai et al. in *The Electrochem. Soc.* PV98-1 (1998), page 453 and G. Kissinger et al. in *Appl. Phys. Lett.* (1998), page 223).

The substrate wafer affected by defects can also have been prepared in an only abrasively polished state, or may also be subjected to a finish polish in addition to an abrasive polish.

Regarding step (b) of the process sequence according to the invention:

The polished surface of the front of the substrate wafer is conditioned during step (b) of the method so that the quality of the subsequently grown epitaxial layer achieves the above mentioned object, with regard to the maximum number of localized light scatterers on the surface. Surprisingly, this is achieved in that the substrate wafer in step (b) of the method, preferably a silicon wafer, is treated in the presence of HCl gas and a silane source at a temperature of from 950 to 1250 degrees Celsius, preferably from 1050 to 1150 degrees Celsius, in an epitaxy reactor. The concentration of the HCl gas and of the silane source is adjusted so that essentially neither deposition of silicon nor etching erosion of semiconductor material takes place. Thus the thickness of the semiconductor wafer is not substantially changed. Some departure from the equilibrium state can be tolerated. The tolerable range is between at most 0.5 $\mu$m/min for deposition and at most 0.2 $\mu$m/min for etching erosion. Also included, in terms of the thickness of the substrate wafer, is a thickness reduction of up to 0.5 $\mu$m, preferably up to 0.2 $\mu$m, or a thickness increase of up to 0.5 $\mu$m. preferably up to 0.2 $\mu$m.

The etching and deposition take place with a sufficiently high reaction rate, so that the silicon on the surface is quasi-mobile and smoothing of the surface and removal of defects on the surface occur. In addition to HCl gas and the silane source, which is a gas, the atmosphere may also contain a doping gas. This is preferred, in particular, if the pretreatment is carried out under conditions with which material is deposited to the tolerable extent. A defect-free, smoothed monocrystalline silicon surface is obtained after the pretreatment. The literature describes that HCl in a hydrogen atmosphere exerts an etching and smoothing effect on a silicon surface (H. M. Liaw and J. W. Rose in: *Epitaxial Silicon Technology,* Academic Press Inc., Orlando Fla. 1986, pages 71–73 and M. L. Hammond in *Handbook of Thin-Film Deposition Processes and Techniques,* Noyes publications 1988, pages 32 and 33). It has now been found, surprisingly, that the additional presence of a silane source can significantly improve and accelerate the smoothing of the surface and the removal of crystal defects.

It is particularly preferred to remove native oxide from the front of the substrate wafer in a first sub-step, preferably by exposing the substrate wafer to a pure hydrogen atmosphere at a temperature of from 900 to 1200 degrees Celsius, preferably at a temperature of from 1100 to 1150 degrees Celsius, in a reactor which is also used for the subsequent epitaxial deposition of a silicon layer. The native oxide can, however, also be removed in another known way, for example by treating the substrate wafer with hydrogen fluoride. The pretreatment according to step (b) is then carried out in a second sub-step, preferably by introducing a mixture comprising a silane source, which is a gas, HCl gas and hydrogen into the epitaxy reactor. If native oxide has previously been removed using hydrogen, it is sufficient to add the silane source which is a gas, and HCl to the hydrogen atmosphere which is already present.

Particular examples of suitable silane sources include silane ($SiH_4$), dichlorosilane ($SiH_2Cl_2$), trichlorosilane ($SiHCl_3$), tetrachlorosilane ($SiCl_4$) or a mixture of these substances, each of which is a gas under the reaction conditions. Trichlorosilane is especially preferred.

Regarding step (c) of the process sequence according to the invention:

In the last step of the process sequence, the substrate wafer obtained by the treatment according to step (b) is provided with an epitaxial layer on at least the front by a standard method. This is done using a CVD (chemical vapor deposition) method, preferably with silane ($SiH_4$), dichlorosilane ($SiH_2Cl_2$), trichlorosilane ($SiHCl_3$), tetrachlorosilane ($SiCl_4$) or a mixture of these substances being delivered to the wafer surface. Here they are decomposed at temperatures of from 600° C. to 1250° C. into elemental silicon and volatile byproducts. They form an epitaxial silicon layer, i.e. a monocrystalline silicon layer grown crystallographically oriented with the semiconductor wafer. Silicon layers having a thickness of from 0.3 $\mu$m to 10 $\mu$m are preferred. The epitaxy layer may be undoped or deliberately doped, for example with boron, phosphorus, arsenic or antimony, in order to establish the conduction type and the desired conductivity.

After the process sequences (a) to (c) according to the invention have been carried out, an epitaxially grown semiconductor wafer having a haze-free surface is provided. This wafer may be sent for characterization of its properties before it is processed further to produce semiconductor components. Measurements using an optical surface inspection instrument working on the laser basis show maximum density of 0.14 localized light scatterers per $cm^2$ of epitaxially grown silicon surface, and a surface roughness (haze) of less than 0.2 ppm and a microroughness of <1 nm RMS.

An epitaxially grown semiconductor wafer produced according to the invention, in particular a silicon wafer having an epitaxial silicon coating, meets the requirements for the production of semiconductor components having linewidths equal to or less than 0.18 $\mu$m. The method according to the invention has proved to be an optimal solution for the production of epitaxially grown silicon wafers having the described features. It obviates cost-intensive steps for local geometry correction such as, for example, plasma etching. Finish polishing is also not necessarily required. Due to the low number of process steps, the risk of fracture is also reduced.

Other objects and features of the present invention will be come apparent from the following detailed description considered in connection with the accompanying Examples which disclose several embodiments of the present invention. It should be understood, however, that the Examples are designed for the purpose of illustration only and not as a definition of the limits of the invention.

DETAILED DESCRIPTION OF PREFERRED EMBODIMENTS

EXAMPLE 1

Step (a): For this example, 300 mm silicon wafers having a surface polished on both sides were provided as substrate wafers, which had been correspondingly polished, cleaned and dried. The roughness of the pre-polished wafers was 0.7 nm RMS (AFM, 1 μby 1 μm).

Step (b): The fronts of the semiconductor wafers were then, prior to the epitaxial coating, subjected in the epitaxy reactor to a pretreatment whose purpose was to remove the native oxide on the front in a first sub-step. Then in a second sub-step, the wafers were pretreated to drastically reduce the roughness on the surface so that, after the epitaxial coating, a semiconductor wafer having significantly improved properties with regard to surface roughness and number of localized light scatterers is provided. This was achieved in that the native oxide was firstly removed in a hydrogen atmosphere at 1120 degrees Celsius for one minute. HCl gas and trichlorosilane were then added to the hydrogen atmosphere for 30 seconds at a temperature of 1140 degrees Celsius, with the purpose of significantly reducing the roughness still existing on the front. The deposition reaction and the etching reaction were in equilibrium at 1000 sccm HCl and 1000 sccm trichlorosilane (saturation temp. 20° C.). The roughness of the pretreated wafer was 0.09 nm RMS.

Step (c): The semiconductor wafers pretreated in accordance with step (b) were then provided on the front with an epitaxially grown silicon wafer according to the prior art in the epitaxy reactor. $SiHCl_3$ was employed as the silicon component and the resistance was adjusted by doping with diborane ($B_2H_6$). At a reaction chamber temperature of 1140° C., a layer of thickness 3.2 μm was deposited at a deposition rate of 3 μm/min.

Characterization of the Epitaxially Grown Silicon Wafers

The silicon wafers with silicon epitaxially grown on the front were characterized with regard to their defects on the epitaxially grown front using a surface inspection instrument, working on the laser principle, of the KLA-Tencor SP1 type. The total number of LLS defects equal to or greater than 0.12 μm, on the DWN ("dark field wide") channel had a mean of 20±9, corresponding to 0.03 LLS/cm², the haze value was 0.06±0.03 ppm, and the RMS was 0.07 nm (1×1 μm²).

COMPARATIVE EXAMPLE 1

Without Pretreatment

Silicon wafers having the same properties as in Example 1 were provided as substrate wafers. Without the pretreatment described in the invention, after the epitaxial coating on the front a mean of 368±124 was found for the LLS defects equal to or greater than 0.12 μm in the DWN channel, corresponding to 0.52±0.18 LLS/cm². The haze value was 0.09±0.04 ppm.

COMPARATIVE EXAMPLE 2

Pretreatment Only With HCl

Silicon wafers having the same properties as in Example 1 were provided as substrate wafers. The front of the silicon wafers was subjected to a pretreatment with HCl in the epitaxy reactor before the epitaxial coating. To do this, HCl gas was added to a hydrogen atmosphere for 30 seconds or 1 minute at a temperature of 1140 degrees Celsius. The roughness of the pretreated wafers was 0.32 nm RMS (30 sec) and 0.17 nm RMS (1 min), i.e. significantly rougher with two times the treatment time than in the case of the pretreatment with HCl and trichlorosilane according to the invention. After the coating with an epitaxial silicon layer, a total LLS defect number of 132±28 (30 sec) and 22±15 (1 min) was respectively found; the haze values were 0.07±0.03 ppm (30 sec) and 0.06±0.03 ppm (1 min), and the RMS roughness was 0.10 nm (30 sec) and 0.09 nm (1 min).

The fronts, backs and edges of the 300 mm silicon wafers produced according to the Example described above and the two Comparative Examples were characterized using the standard methods, known to the person skilled in the art, with regard to metal contamination of the wafer surface and minority charge carrier lifetime, as well as nanotopological properties. No statistically relevant discrepancies between the individual experimental groups were observed.

EXAMPLE 2

Step (a): For this Example, 300 mm silicon wafers having a polished surface were provided as substrate wafers, on which an annular buildup of defect seeds, a so-called OSF ring, could be detected.

Step (b): The fronts of the semiconductor wafers were, prior to the epitaxial coating, subjected in the epitaxy reactor to a pretreatment whose purpose was to minimize the number of localized light scatterers detectable after the epitaxial coating. This was achieved in that the native oxide was firstly removed in a hydrogen atmosphere at 1150 degrees Celsius for one minute. HCl gas and trichlorosilane were then added to the hydrogen atmosphere for a further 60 seconds at a temperature of 1120 degrees Celsius (900 sccm hydrogen chloride and 2000 sccm trichlorosilane (saturation temp. 20° C.)).

Step (c): The semiconductor wafers pretreated in accordance with step (b) were then provided on the front with an epitaxially grown silicon wafer according to the prior art in the epitaxy reactor. The coating took place at 1120° C. and lasted 75 seconds.

Characterization of the Epitaxially Grown Silicon Wafers

The silicon wafers with silicon epitaxially grown on the front were characterized with regard to their defects on the epitaxially grown front using a surface inspection instrument, working on a laser principle, of the KLA-Tencor SP1 type. The total number of LLS defects greater than 0.12 μm was 40.

COMPARATIVE EXAMPLES 3–6

With Heat Treatment

Silicon wafers having the same properties as in Example 2 were provided as substrate wafers. Before the epitaxial coating, the silicon wafers were subjected to a heat treatment lasting 60 seconds in hydrogen at a temperature of 1120° C. (Comparative Example 3), 1150° C. (Comparative Example 4) and 1200° C. (Comparative Example 5), instead of a pretreatment according to the invention. In Comparative Example 6, the treatment temperature was likewise 1150° C., but the treatment time was 120 seconds. The conditions of the epitaxial coating subsequent to the heat treatment were identical to those of Example 2 in the case of Comparative Examples 4 to 6. In the case of Comparative Example 3, the coating took place at 1090° C. and lasted 81 seconds. The number of LLS defects respectively counted after the epitaxial coating was 2577 (Comparative Example 3), 428 (Comparative Example 4), 239 (Comparative Example 5) and 509 (Comparative Example 6).

COMPARATIVE EXAMPLE 7

Pretreatment Only With HCl

Silicon wafers having the same properties as in Example 2 were provided as substrate wafers. In contrast to Example 2, trichlorosilane was not added. The following epitaxial coating was carried out under the same conditions as in Example 2. The number of LLS defects detected was 110.

Accordingly, while a few embodiments of the present invention have been shown and described, it is to be understood that many changes and modifications may be made thereunto without departing from the spirit and scope of the invention as defined in the appended claims.

What is claimed is:

1. A method for the production of a semiconductor wafer having a front and a back and an epitaxial layer of semiconductor material deposited on the front, and said method comprising the following process steps:
   (a) prepare a substrate wafer having a polished front and a specific thickness, wherein the polished front is achieved by subjecting the wafer to an abrasive polishing only;
   (b) removing native oxide from the front and pretreating the front of the substrate wafer in the presence of HCl gas and a silane source at a temperature of from 950 to 1250 degrees Celsius in a epitaxy reactor the thickness of the substrate wafer remaining substantially unchanged; and
   (c) depositing the epitaxial layer on the front of the pretreated substrate wafer; and said epitaxial layer having a surface which has a maximum density of 0.14 localized light scatterers per cm$^2$ with a scattering cross section of greater than or equal to 0.12 μm.

2. The method as claimed in claim 1, wherein the polished front according to step (a) is created using an abrasive polish as the only polishing step.

3. The method as claimed in claim 1, comprising simultaneously polishing the front and the back of the substrate wafer to create the polished front.

4. The method as claimed in claim 1, comprising polishing only the front of the substrate wafer to create the polished front.

5. The method as claimed in claim 1, comprising carrying out the pretreatment of the substrate wafer and the deposition of the epitaxial layer immediately after one another in the epitaxy reactor.

6. The method as claimed in claim 1, wherein the epitaxial layer deposited in step (c) has a thickness of from 0.3 μm to 10 μm, and is deposited at a temperature of from 600° C. to 1250° C.

7. The method as claimed in claim 1, wherein the epitaxial layer deposited in step (c) is hydrophilicized using an oxidizing gas.

8. The method as claimed in claim 1, wherein the epitaxial layer deposited in step (c) is wet-chemically hydrophilicized.

9. In a method for producing integrated semiconductor components, the improvement which comprises, utilizing the epitaxially grown semiconductor wafer of claim 1 for producing said components.

10. A method for the production of a semiconductor wafer having a front and a back and an epitaxial layer of semiconductor material deposited on the front, and said method comprising the following process steps:
    (a) preparing a substrate wafer having a polished front and a specific thickness, wherein the substrate wafer is rich in defects that can be detected which are selected from the group consisting of large near surface oxide precipitates and oxide filled voids;
    (b) removing native oxide from the front and pretreating the front of the substrate wafer in the presence of HCl gas and a silane source at a temperature of from 950 to 1250 degrees Celsius in an epitaxy reactor, the thickness of the substrate wafer remaining substantially unchanged; and
    (c) depositing the epitaxial layer on the front of the pretreated substrate wafer; and said epitaxial layer having a surface which has a maximum density of 0.14 localized light scatterers per cm$^2$ with a scattering cross section of greater than or equal to 0.12 μm.

11. The method as claimed in claim 10, wherein the substrate wafer contains oxygen in a concentration range of $3*10^{17}$ to $9*10^{17}$ atoms of oxygen cm$^{-3}$ and at least one dopant which is selected from the group consisting of nitrogen, carbon and boron, and the concentration of the dopant lies in one of the following concentration ranges, depending on the dopant type:

nitrogen concentration range: $1*10^{15}$ to $5*10^{17}$ atoms of nitrogen cm$^{-3}$ carbon concentration range: $1*10^{15}$ to $5*10^{17}$ atoms of carbon cm$^{-3}$ boron concentration range: greater than $5*10^{17}$ atoms of boron cm$^{-3}$.

12. The method as claimed in claim 10, comprising simultaneously polishing the front and the back of the substrate wafer to create the polished front.

13. The method as claimed in claim 10, comprising polishing only the front of the substance wafer to create the polished front.

14. The method as claimed in claim 10, comprising carrying out the pretreatment of the substrate wafer and the deposition of the epitaxial layer immediately after one another in the epitaxy reactor.

15. The method as claimed in claim 10, wherein during the pretreatment of the substrate wafer according to step (b), removing native oxide from the substrate wafer in a first sub-step and, in a second sub-step, treating the substrate wafer at a temperature of from 950 to 1250 degrees Celsius in a hydrogen atmosphere to which HCl gas and a silane source are added.

16. The method as claimed in claim 15, wherein the silane source is selected from the group consisting of silane ($SiH_4$), dichlorosilane ($SiH_2Cl_2$), trichlorosilane ($SiHCl_2$), tetrachlorosilane ($SiCl_4$) and mixtures thereof.

17. The method as claimed in claim 15, wherein the ratio of the HCl concentration and silane concentration leads to deposition of silicon with a deposition rate of less than 0.5 μm/min, or to etching of silicon with an etching rate of less than 0.2 μm/min, and less than 0.5 μm of material is eroded from the surface of the substrate wafer and less than 0.5 μm of material is deposited on the surface of the substrate wafer.

18. The method as claimed in claim 10, wherein the epitaxial layer deposited in step (c) has a thickness of from 0.3 μm to 10 μm, and is deposited at a temperature of from 600° C. to 1250° C.

19. The method as claimed in claim 10, wherein the epitaxial layer deposited in step (c) is hydrophilicized using an oxidizing gas.

20. The method as claimed in claim 10, wherein the epitaxial layer deposited in step (c)is wet-chemically hydrophilicized.

21. In a method for producing integrated semiconductor components, the improvement which comprises, utilizing the epitaxially grown semiconductor wafer of claim 10 for producing said components.

22. A method for the production of a semiconductor wafer having a front and a back and an epitaxial layer of semiconductor material deposited on the front, and said method comprising the following process steps:

(a) preparing a substrate wafer having a polished front and a specific thickness;

(b) pretreating the front of the substrate wafer in an epitaxy reactor, wherein during the pretreatment of the substrate wafer according to step (b), removing native oxide from the substrate wafer in a first sub-step in a pure hydrogen atmosphere at a temperature of 1100° to 1150° C. and, in a second sub-step, treating the substrate wafer at a temperature of from 950 to 1250 degrees Celsius in a hydrogen atmosphere to which HCl gas and a silane source are added, and the thickness of the substrate wafer remaining substantially unchanged; and (c) depositing the epitaxial layer on the front of the pretreated substrate wafer; and said epitaxial layer having a surface which has a maximum density of 0.14 localized light scatterers per $cm^2$ with a scattering cross section of greater than or equal to 0.12 $\mu$m.

23. The method as claimed in claim 22, wherein the silane source is selected from the group consisting of silane ($SiH_4$, dichlorosilane ($SiH_2Cl_2$), trichlorosilane ($SiHCl_3$) tetrachlorosilane ($SiCl_4$) and mixtures thereof.

24. The method as claimed in claim 22, wherein the ratio of the HCl concentration and silane concentration leads to deposition of silicon with a deposition rate of less than 0.5 $\mu$m/min or to etching of silicon with an etching rate of less than 0.2 $\mu$m/min, and less than 0.5 $\mu$m of material is eroded from the surface of the substrate wafer and less than 0.5 $\mu$m of material is deposited on the surface of the substrate wafer.

25. A method for the production of a semiconductor wafer having a front and a back and an epitaxial layer of semiconductor material deposited on the front, and said method comprising the following process steps:

(a) preparing a substrate wafer having a polished front and a specific thickness;

(b) pretreating the front of the substrate wafer in an epitaxy reactor, wherein during the pretreatment of the substrate wafer according to step (b), removing native oxide from the substrate wafer in a first sub-step using hydrogen fluoride and, in a second sub-step, treating the substrate wafer at a temperature of from 950 to 1250 degrees Celsius in a hydrogen atmosphere to which HCl gas and a silane source are added, and the thickness of the substrate wafer remaining substantially unchanged; and (c) depositing the epitaxial layer on the front of the pretreated substrate wafer; and said epitaxial layer having a surface which has a maximum density of 0.14 localized scatterers per $cm^2$ with a scattering cross section of greater than or equal to 0.12 $\mu$m.

* * * * *